US006870176B2

(12) United States Patent
Rohrbacher et al.

(10) Patent No.: US 6,870,176 B2
(45) Date of Patent: Mar. 22, 2005

(54) CADMIUM SULFOSELENIDE SURFACE-MOUNTABLE OPTOCOUPLER

(75) Inventors: Fred Rohrbacher, Westmount (CA); Michel Chiasson, LaSalle (CA); Marc Lacroix, Montreal (CA)

(73) Assignee: Silonex, Inc., Montreal ( * ) Notice: Subject to any disclaimer, the term of this patent is extended or adjusted under 35 U.S.C. 154(b) by 272 days.

(21) Appl. No.: 10/315,317

(22) Filed: Dec. 6, 2002

(65) Prior Publication Data

US 2004/0011944 A1 Jan. 22, 2004

Related U.S. Application Data

(60) Provisional application No. 60/336,689, filed on Dec. 7, 2001.

(51) Int. Cl.$^7$ .............................................. G02B 27/00
(52) U.S. Cl. ...................................... 250/551; 250/239
(58) Field of Search ................................ 250/551, 239, 250/214.1; 257/81, 82, 83, 84, 433

(56) References Cited

U.S. PATENT DOCUMENTS 3,736,546 A * 5/1973 Jones ........................... 338/15
5,296,715 A    3/1994 Kronberg

OTHER PUBLICATIONS

Optoelectronics Designers Handbook, Clairex Electronics Optoelectronics Catalog, 1989, Section 8, pp. 8–7 and 8–3.

* cited by examiner

*Primary Examiner*—Que T. Le
(74) *Attorney, Agent, or Firm*—Darby & Darby

(57) ABSTRACT

The invention concerns an optocoupler. The optocoupler includes a substrate made of optically opaque electrically insulating material metallized to provide conductive traces on a top surface thereof which are electrically linked to metal pads on a bottom surface. A cadmium sulfoselenide photoresistor having an active surface is placed over the substrate with the active surface facing the substrate where the photoresistor has two electrodes. Metal leads connect each of the two electrodes of the photoresistor to two metallized traces on the substrate. A light emitting diode (LED) chip is mounted on the substrate facing the active surface of the photoresistor. The LED chip has a top and bottom electrode, where the bottom electrode is electrically attached to a third metallized trace and the top electrode is wire bonded to a fourth metallized trace. A cover made of optically opaque material is fixed to the substrate so as to enclose the photoresistor and the LED chip in a light tight enclosure. In an alternative embodiment of the invention, the photoresistor and the LED chip can lie side by side and be in optical communication with each other through a reflective coating on the inside of the cover.

14 Claims, 3 Drawing Sheets

CADMIUM SULFOSELENIDE SURFACE-MOUNTABLE OPTOCOUPLER

REFERENCE TO RELATED APPLICATIONS

This application claims the priority of U.S. Provisional Application No. 60/336,689 filed Dec. 7, 2001, which is incorporated herein in it's entirety.

FIELD OF THE INVENTION

The present invention is directed to an optocoupler composed of a light-emitting diode (LED) and of a sulfoselenide photoresistor, assembled in a surface-mountable package, primarily intended for use in audio circuits and audio equipment.

BACKGROUND OF THE INVENTION

Optocouplers made of a combination sulfoselenide photoresistor and LED presently exist. They are used to couple electrical signals in analog circuits that process audio signals. They have special properties that make them useful in applications such as soft switching, signal compressors and signal limiters. They consist of a LED shining light onto a photoresistor inside a light-tight package. The photoresistor, generally made of a sulfoselenide compound, has the property that its electrical resistance varies with the amount of light incident on its surface. When the current driving the LED is changed, the amount of light that is emits also changes proportionally, and consequently also the electrical resistance of the photoresistor. The particular characteristics that make such optocouplers useful in analog audio circuits are their relatively slow response times, that enable them to smooth the signals of undesirable sharp components, and their low distortion, or low propensity to generate harmonics of the signals which they conduct.

The previously available optocouplers that comprise sulfoselenide resistors have been made in packages for mounting on through-hole circuit boards. This prevents their economical usage in volume-produced audio equipment, where electronic circuits are now assembled on surface-mount circuit boards, rather than through-hole circuit boards, as the former lend themselves to higher component density and lower fabrication costs. Therefore, the prior art has some disadvantages.

SUMMARY OF THE INVENTION

It is an object of the invention to provide an optocoupler comprising a cadmium sulfoselenide photoresistor and a LED, mounted in a surface-mountable package, so that it is economical to manufacture and also to use in volume-produced audio equipment.

In accordance with the invention, this object is achieved with an optocoupler comprising:

- a substrate made of optically opaque, electrically insulating material, metallized so as to provide conductive traces on a top surface thereof, said traces being electrically linked to metal pads on a bottom surface;
- a cadmium sulfoselenide photoresistor having an active surface, placed over said substrate with said active surface facing said substrate, said photoresistor having two electrodes;
- metal leads electrically connecting each of said two electrodes of the photoresistor to two metallized traces on said substrate;
- a light emitting diode (LED) chip, mounted on said same substrate, facing said active surface of the photoresistor and having a top and bottom electrode, where said bottom electrode is electrically attached to a third metallized trace on said substrate, and said top electrode is wire bonded to still another metallized trace; and
- a cover made of optically opaque material, fixed to said substrate so as to enclose the photoresistor and the LED chip in a light tight enclosure.

In another aspect of the invention, the surface mountable cadmium sulfoselenide optocoupler comprises:

- an optically opaque, electrically insulating substrate having conductive traces on a top surface thereof, said traces being electrically linked to metal pads on a bottom surface of said substrate;
- a cadmium sulfoselenide photoresistor having an active surface, and two electrodes paced over said substrate with said active surface facing away from said substrate;
- metal leads electrically connecting each of said two electrodes to a first and second trace of said traces;
- a light emitting diode chip having two electrodes, said LED chip being placed over said substrate, said two electrodes of said LED chip being connected to a third and fourth trace of said traces; and
- an optically opaque cover enclosing said photosensor and said LED chip fixed to said top surface of said substrate, said cover having a reflective or diffusive inner surface.

In a further aspect of the invention, the surface mountable cadmium sulfoselenide optocoupler comprises the following:

- a cadmium sulfoselenide photoresistor having an active surface; and
- a light emitting diode chip in optical communication with said active surface of said photoresistor; said photoresistor and said light emitting diode being electrically and mechanically connected to an optically opaque substrate and being encased inside an optically opaque housing sealingly fixed to said substrate.

DESCRIPTION OF THE DRAWINGS

Advantages of the invention will become apparent from a reading of the following detailed description made with reference to the following drawings in which.

DETAILED DESCRIPTION OF THE INVENTION

Figure 1:
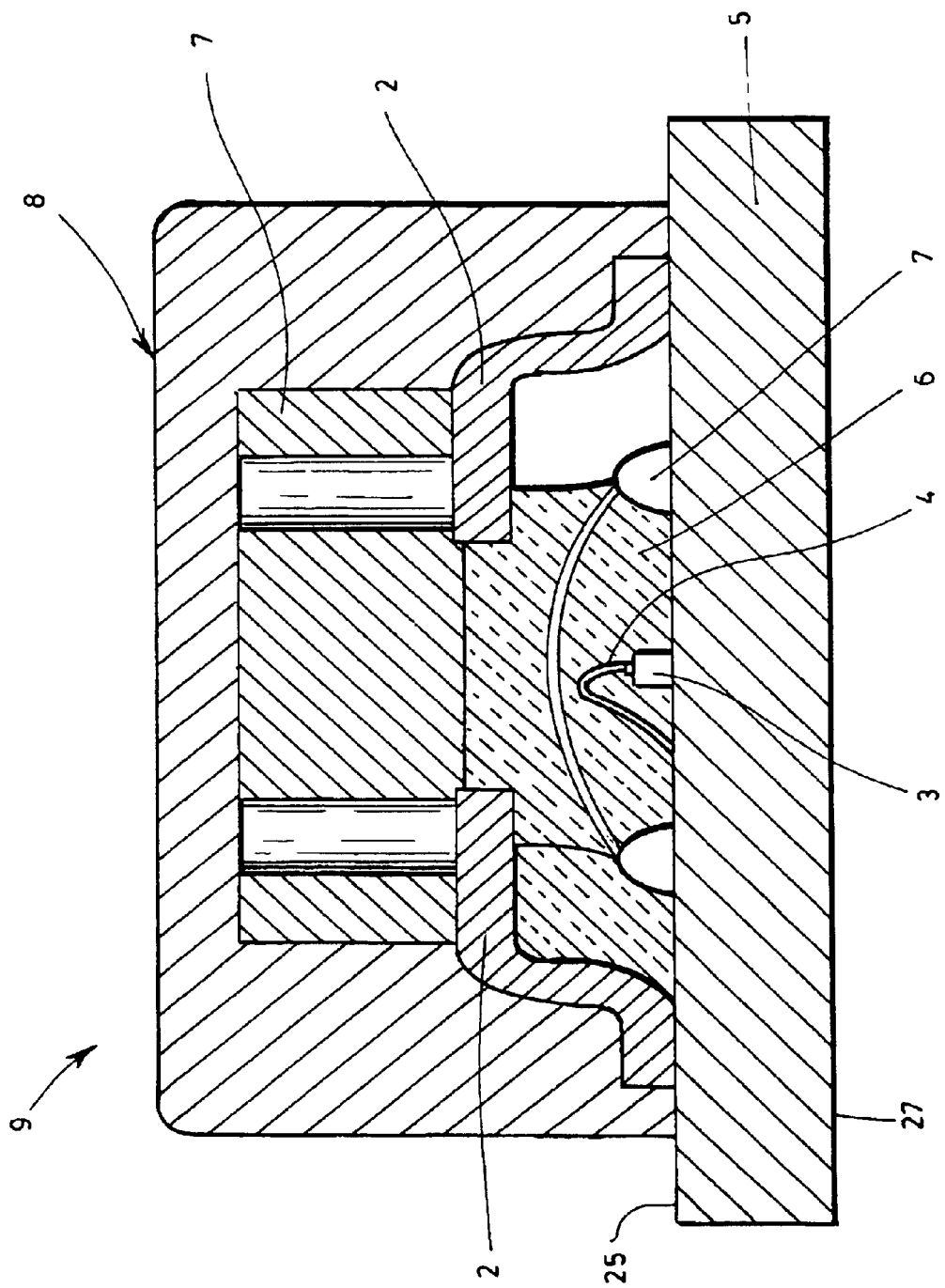
FIG. 1 is a lateral cut view of a surface-mountable optocoupler according to a preferred embodiment of the invention.
Figure 2:
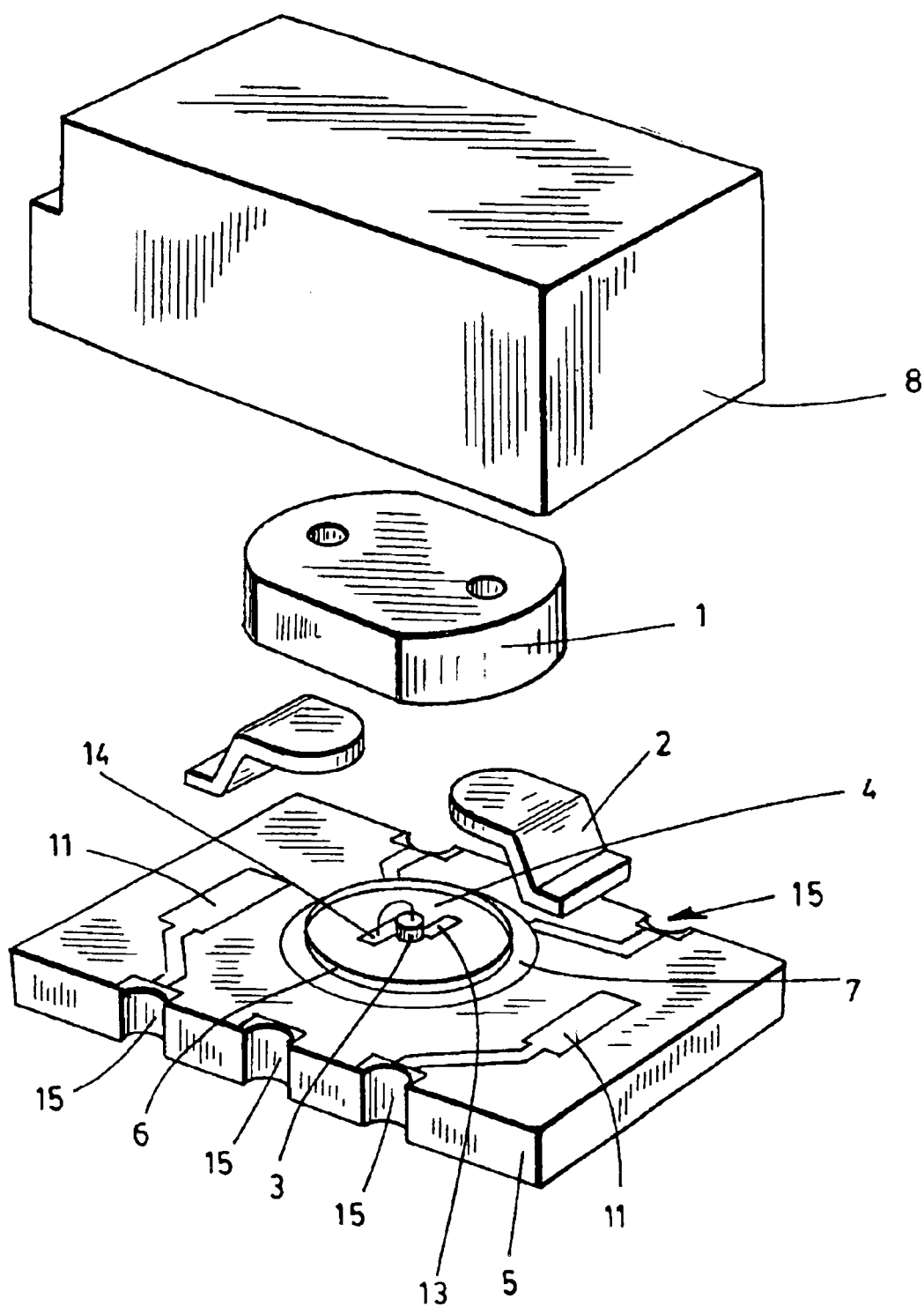
FIG. 2 is an exploded view of the same, showing all the parts.
Figure 3:
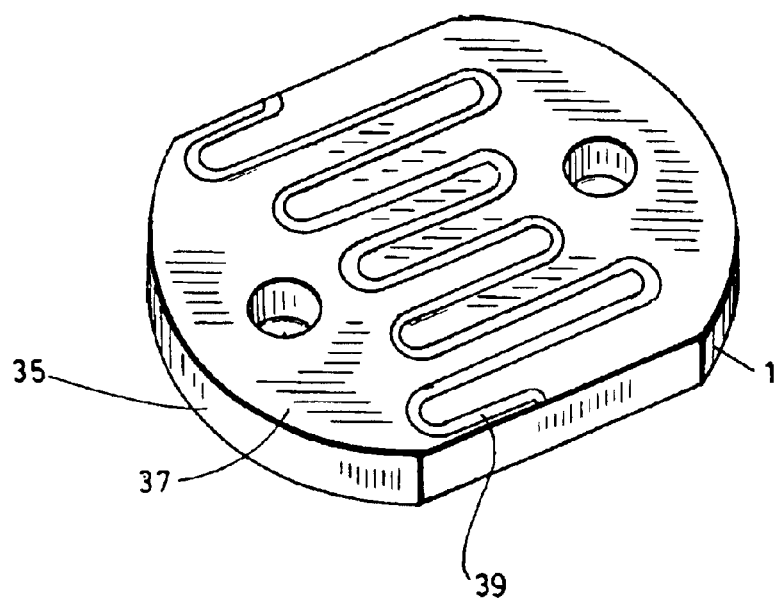
FIG. 3 illustrates the active side of the cadmium sulfoselenide photoresistor.
Figure 4:
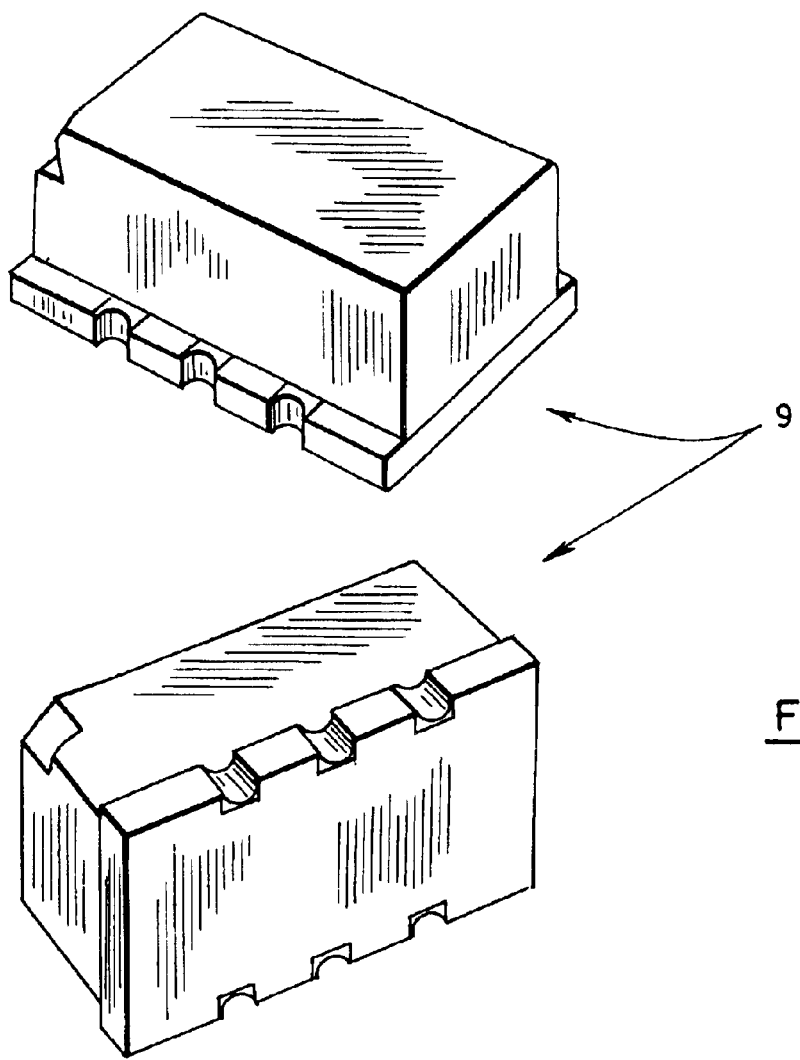
FIG. 4 shows external views of a complete optocoupler.

Referring now to the following Figures, the present invention concerns a surface-mountable cadmium sulfoselenide optocoupler 9. The optocoupler consists of the following basic elements. A cadmium sulfoselenide photoresistor 1 (shown with its active side down in FIG. 2; the active side of the same photoresistor is illustrated in FIG. 3) is electrically and mechanically linked by a pair of metallic leads 2 to an optically opaque and electrically insulating substrate 5, so that its active surface faces towards the substrate, and so that the two electrodes of the photoresistor are electrically connected to two distinct metallized traces 11 and 12 on the substrate. A light emitting diode (LED) chip 3 is mounted on the same substrate 5, so that its bottom electrode makes electrical contact with another metal trace 13 on the substrate, and its top electrode is connected by a wire bond 4 to still another metal trace 14 on the same substrate. To complete the optocoupler, a cover 8 made of some optically opaque material is glued, or affixed by another appropriate manner, to the outer margin of the top surface 25 of substrate 5, so that the resulting joint is opaque to light.

In a preferred embodiment, the traces 11, 12, 13 and 14 leading to castellations 15 along the edges of the substrate, as well as the castellations themselves, are made of gold- or silver-plated copper.

The substrate 5 can be made of composite material, such as those commonly used to manufacture printed circuit boards, preferably black for optimum opacity to light, or some other suitable dielectric material. It is fitted with metallized traces on its top surface 11, 12, 13 and 14, and with metallized castellations 15 on its lateral edges. In the preferred embodiment illustrated in the figures, there are three castellations on each edge, the central castellation on either side serving no electrical purpose, but providing better mechanical stability when the optocoupler 9 is mounted onto a circuit. Traces 11, 12, 13 and 14 are respectively connected to the other four castellations 15, other than the ones in the middle of each edge, and to metallized pads on the bottom surface 27 connected to said castellations, so that two of these metallized pads become connected respectively to the two electrodes of the photoresistor 1, and the other two metal pads to the two electrodes of the LED chip 3.

The metallization of the sides and bottom surface of the substrate is performed in a manner that makes it surface mountable by standard soldering methods used in the electronic assembly industry.

The photoresistor consists of a ceramic substrate 35 covered with a film 37 of a kiln-fired combination of cadmium sulfide, cadmium selenide and dopants, processed so that the electrical resistivity of the film is highly variable with the intensity of light it is exposed to. Interdigitalized metallic electrodes 39 are deposited over the photoresistive film, to allow electrical connection to the active medium. The interdigitalized geometry minimizes the electrical resistance between the electrodes. The making of the photoresistor is background art and is not in itself part of this invention.

Optionally, an optically transparent and electrically insulating material 6, such as an optical grade epoxy polymer, is dispensed and shaped so that it covers the LED chip and fills the gap between the substrate 5 and the bottom (active) surface of the photoresistor 1.

Also optionally, a ring of optically opaque material 7 is dispensed and cured on the substrate 5, around the LED chip 3, prior to the placement of the optically transparent material 6, for the purpose of restraining the latter to the immediate area surrounding the LED chip.

Optionally, to maximize the amount of light impinging the active surface of the photoresistor 1, the surface of the substrate surrounding the LED chip 3, inside an area defined by a ring 7 surrounding said LED chip 3, can be completely metallized, with the exception of a thin open gap along the metal traces connecting to the electrodes of the LED chip 3. Such a metallized surface, especially if coated with gold, will reflect more light emitted by the LED chip towards the photoresistor, which may offer functional advantages for some applications.

In another implementation of the invention, the photoresistor and the LED chip are mounted side by side on the substrate, rather than face to face. In this case the photoresistor active surface faces up, and the opaque cover is fitted with a reflective or diffusive inner surface (or both), so that as much as possible of the light emitted by the LED chip is directed to the surface of the photoresistor. Compared to the preferred embodiment, this alternate arrangement makes a less efficient use of the light emitted by the LED, and results into an optocoupler with a larger footprint, but it may bring advantages of simplicity in fabrication.

The spectral characteristics of the LED chip must be such that there is some overlap between the optical spectral band of the LED and the spectral sensitivity of the photoresistor. In order to obtain an optocoupler in which the electrical resistance of the photoresistor is minimum for a given value of the LED excitation current, a feature which is desirable for most applications, then the LED chip is selected so that its peak wavelength of emission is as close as possible to that where the photoresistor has peak sensitivity.

In use, when a source of electrical current is connected to the two metallized points under the substrate that are linked to the LED chip, this chip emits light with an intensity proportional to that of the applied current, up to the specified current limit of the particular chip being used. The light is emitted in various directions, some of it directly towards the photoresistor surface, but much of it away from it. In the embodiment where an optically transparent polymer is placed between the LED chip and the photoresistor active surface, this material provides a light channel which renders more efficient the transfer of light from one to the other, chiefly as a result of the reflection of light off the internal surfaces of the lateral boundaries of the channel.

Under the influence of the incident light, the electrical resistivity of the photoresistor medium decreases, hence the electrical resistance between the two connection points under the substrate that are electrically linked to the electrodes of the photoresistor. When no current is supplied to the LED chip, the inside of the cavity is dark and the resistance of the photoresistor is at its maximum.

The contrast between the resistance when no current is applied, and that when a current of a certain value is applied, is higher when the light is transferred more efficiently from the LED chip to the photoresistor surface. Since a higher contrast is generally valued as a benefit for most applications, efficient light coupling leads to optocouplers with better performance.

The invention presents advantages over prior art. Its surface-mountable configuration enables the use of this type of optocoupler in circuits manufactured on the basis of the surface-mount assembly method, rather than only in circuits made on the basis of the through-hole method, as was the case with the prior art. The surface-mount method has now become the preferred approach for the low cost production of electronic circuits in large volumes.

In addition, the compactness of the apparatus gives it a minimum footprint, therefore allowing its effective use in circuits that must fit into audio systems where space is at a premium.

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. A surface mountable cadmium sulfoselenide optocoupler, said optocoupler comprising:
   a substrate made of optically opaque, electrically insulating material, metallized so as to provide conductive traces on a top surface thereof, said traces being electrically linked to metal pads on a bottom surface;
   a cadmium sulfoselenide photoresistor having an active surface, placed over said substrate with said active surface facing said substrate, said photoresistor having two electrodes;
   metal leads electrically connecting each of said two electrodes of the photoresistor to two metallized traces on said substrate;
   a light emitting diode (LED) chip, mounted on said same substrate, facing said active surface of the photoresistor and having a top and bottom electrode, where said bottom electrode is electrically attached to a third metallized trace on said substrate, and said top electrode is wire bonded to still another metallized trace; and
   a cover made of optically opaque material, fixed to said substrate so as to enclose the photoresistor and the LED chip in a light tight enclosure.

2. The optocoupler of claim 1 wherein the substrate is made of black composite material.

3. The optocoupler of claim 1 wherein said metallized traces are made of gold- or silver-coated copper.

4. The optocoupler of claim 1, wherein said bottom surface of said substrate is adapted for surface mounting on a printed circuit board.

5. The optocoupler of claim 1 wherein the composition of the active film of the photoresistor, and the nature of the LED chip, are selected so that the maximum sensitivity of the former, and the maximum of optical emission of the latter, take place at similar wavelengths of light.

6. The optocoupler of claim 1 wherein an optically transparent and electrically resistive material is placed between the LED chip and the active surface of the photoresistor, so as to optimize the transfer of light from one to the other.

7. The optocoupler of claim 6, wherein said electrically resistive material is optical grade epoxy resin.

8. The optocoupler of claim 6 wherein a ring of optically opaque material is placed in a substantially circular manner around the LED chip.

9. The optocoupler of claim 1 wherein the surface of the substrate surrounding the LED chip is completely metallized, with the exception of a thin open gap along the metal traces connecting to the electrodes of the LED chip.

10. A surface mountable cadmium sulfoselenide optocoupler, said optocoupler comprising:
    an optically opaque, electrically insulating substrate having conductive traces on a top surface thereof, said traces being electrically linked to metal pads on a bottom surface of said substrate;
    a cadmium sulfoselenide photoresistor having an active surface, and two electrodes paced over said substrate with said active surface facing away from said substrate;
    metal leads electrically connecting each of said two electrodes to a first and second trace of said traces;
    a light emitting diode chip having two electrodes, said LED chip being placed over said substrate, said two electrodes of said LED chip being connected to a third and fourth trace of said traces; and
    an optically opaque cover enclosing said photosensor and said LED chip fixed to said top surface of said substrate, said cover having a reflective or diffusive inner surface.

11. The optocoupler of claim 10, wherein said substrate is made of a black composite material.

12. The optocoupler of claim 10, wherein said traces are made of gold- or silver-coated copper.

13. The optocoupler of claim 10, wherein said bottom surface of said substrate is adapted for surface mounting on a printed circuit board.

14. A surface mountable cadmium sulfoselenide optocoupler comprising:
    a cadmium sulfoselenide photoresistor having an active surface;
    a light emitting diode chip in optical communication with said active surface of said photoresistor; said photoresistor and said light emitting diode being electrically and mechanically connected to an optically opaque substrate and being encased inside an optically opaque housing sealingly fixed to said substrate.

* * * * *